United States Patent
Cecchi et al.

(10) Patent No.: US 6,933,743 B2
(45) Date of Patent: Aug. 23, 2005

(54) DUAL MODE ANALOG DIFFERENTIAL AND CMOS LOGIC CIRCUIT

(75) Inventors: Delbert R. Cecchi, Rochester, MN (US); Michael Launsbach, Rochester, MN (US); Curtis Walter Preuss, Rochester, MN (US); David W. Siljenberg, Byron, MN (US)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 10/718,219

(22) Filed: Nov. 20, 2003

(65) Prior Publication Data

US 2005/0110521 A1    May 26, 2005

(51) Int. Cl.[7] ............................................. H03K 19/00
(52) U.S. Cl. .......................................... 326/16; 326/86
(58) Field of Search .............................. 326/16, 82–83, 326/86, 87; 324/537, 73.1; 714/43, 44

(56) References Cited

U.S. PATENT DOCUMENTS 6,087,879 A * 7/2000 Takahashi et al. .......... 327/333
6,337,819 B1 * 1/2002 Shinozaki .................... 365/201

* cited by examiner

Primary Examiner—James H. Cho
(74) Attorney, Agent, or Firm—Joan Pennington

(57) ABSTRACT

A dual mode, analog differential and complementary metal oxide semiconductor (CMOS) logic circuit is provided. The circuit includes a differential input for receiving a differential input signal. A switch pair is coupled to the differential input. A pair of load resistors coupled to the switch pair defines a differential output for providing a differential output signal. A current source is coupled to the switch pair. A control input receives a control signal and control circuitry coupled to the control input disable the current source to select a CMOS testing mode responsive to the control signal being activated.

20 Claims, 4 Drawing Sheets

US 6,933,743 B2

DUAL MODE ANALOG DIFFERENTIAL AND CMOS LOGIC CIRCUIT

FIELD OF THE INVENTION

The present invention relates generally to semiconductor devices, and more particularly, relates to a dual mode, analog differential and complementary metal oxide semiconductor (CMOS) logic circuit.

DESCRIPTION OF THE RELATED ART

High speed data links require analog differential circuitry to meet performance requirements. When such analog differential circuitry is implemented in application specific integrated circuit (ASIC) technology, strict methodology and testing rules must be met. These testing rules are intended for complementary metal oxide semiconductor (CMOS) logic circuits and generally are difficult or impossible to apply to analog differential circuitry.

One past approach has been to provide duplicate circuits; a first analog differential circuit that is normally used or is the functional circuit and a second duplicate circuit that is a CMOS copy of the functional analog differential circuit. The second CMOS duplicate circuit is provided merely to mimic the first functional analog differential circuit during test modes. A selection switch is provided for selecting between the duplicate circuits.

Significant disadvantages of this approach are that the first functional analog differential circuit is not really tested, and extra circuitry is required for the CMOS duplicate circuit and the selection switch. Also the capacitive loads of the selection circuitry compromise the performance of the functional analog differential circuit.

SUMMARY OF THE INVENTION

A principal object of the present invention is to provide a dual mode, analog differential and complementary metal oxide semiconductor (CMOS) logic circuit. Other important objects of the present invention are to provide such dual mode, analog differential and complementary metal oxide semiconductor (CMOS) logic circuit substantially without negative effect and that overcome many of the disadvantages of prior art arrangements.

In brief, a dual mode, analog differential and complementary metal oxide semiconductor (CMOS) logic circuit is provided. The circuit includes a differential input for receiving a differential input signal. A switch pair is coupled to the differential input. A pair of load resistors coupled to the switch pair defines a differential output for providing a differential output signal. A current source is coupled to the switch pair. A control input receives a control signal and control circuitry coupled to the control input disable the current source to select a CMOS testing mode responsive to the control signal being activated.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
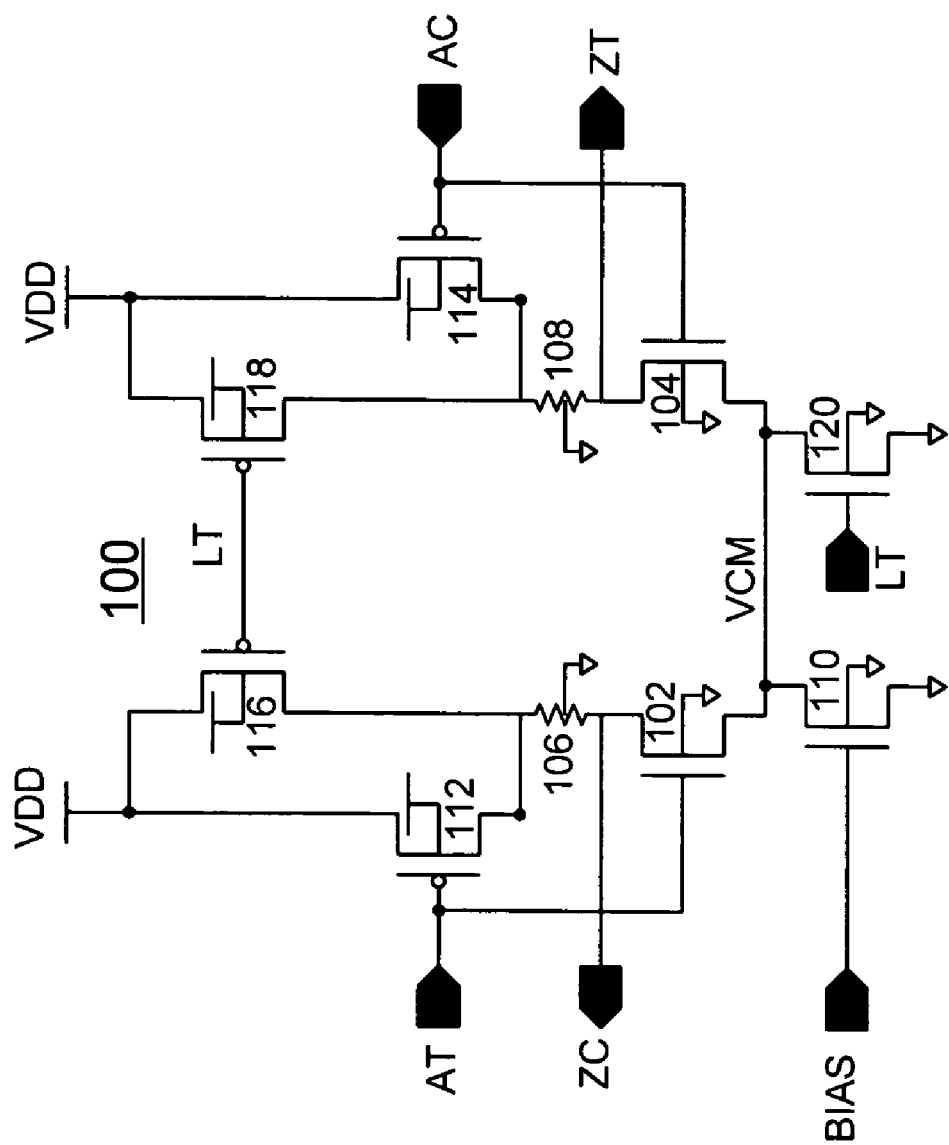
FIG. 1 is a schematic diagram illustrating an exemplary dual mode, analog differential and complementary metal oxide semiconductor (CMOS) logic circuit in accordance with the preferred embodiment.

Having reference now to the drawings, in FIG. 1 there is shown an exemplary dual mode, analog differential and complementary metal oxide semiconductor (CMOS) logic circuit in accordance with the preferred embodiment generally designated by the reference character 100. Dual mode, analog differential and CMOS logic circuit 100 functions normally as an analog differential circuit and functions as CMOS logic for test purposes.

In accordance with features of the preferred embodiment, dual mode, analog differential and CMOS logic circuit 100 continues to function during leak testing where no DC current is allowed. Typically analog differential circuits require DC current and therefore are not functional during leak testing. Dual mode, analog differential and CMOS logic circuit 100 allows a no DC current mode or CMOS mode for test purposes. Dual mode, analog differential and CMOS logic circuit 100 functions as an analog differential circuit providing high speed operation to meet normal performance requirements. During the CMOS mode with no DC current, the dual mode, analog differential and CMOS logic circuit 100 operates at a substantially slower speed for test purposes and forms a pair of CMOS inverters during the CMOS testing mode. The pair of CMOS inverters during the CMOS testing mode provide a differential output signal of a full rail-to-rail swing signal from a positive supply rail to a negative supply rail.

A plurality of signals including a pair of differential true and complement input signals (AT), (AC), a leak test (LT) signal, and a bias (BIAS) signal are applied to the dual mode, analog differential and CMOS logic circuit 100. Dual mode, analog differential and CMOS logic circuit 100 provides a pair of output signals or differential true and complement output signals (ZT), (ZC) during both normal analog differential circuit function and test CMOS logic circuit function.

Dual mode, analog differential and CMOS logic circuit 100 is a differential buffer with a switch pair formed of a pair of N-channel field effect transistors (NFETS) 102, 104, a pair of load resistors 106, 108 and an NFET current source 110 at the common source connection of the NFET switching pair 102, 104. A first pair of P-channel field effect transistors (PFETs) 112, 114 and a parallel second pair of P-channel field effect transistors (PFETs) 116, 118 are connected in series between the pair load resistors 106, 108 and a voltage supply rail VDD. The PFETs 116, 118 are substantially larger than the PFETs 112, 114. For example, PFETs 116, 118 are ten times larger than the PFETs 112, 114. The small PFETs 112, 114 are provided for operation during the CMOS mode of logic circuit 100.

A control NFET 120 in parallel with the current source NFET 110 is connected between the common source connection of the NFET switching pair 102, 104 at node labeled VCM and ground. The differential true and complement input signals AT, AC respectively are applied to a gate of the respective switching NFETs 102, 104 and respective small PFETs 112, 114. The BIAS signal is applied to the gate of current source NFET 110. The leak test LT signal is applied to the respective gate of the NFET 120 and the PFETs 116, 118 having a common gate connection.

In normal operation or analog differential mode, the LT input is low and the pair of small PFETs 112, 114 in series with the load resistors 106, 108 are shorted out by larger PFETs 116, 118 which connect the supply voltage to the load resistors 106, 108 and these larger PFETs 116, 118 effectively become part of the respective load resistors 106, 108. The control NFET 120 is turned off when the LT input is low.

In the testing or CMOS mode, where the LT pin goes high, the larger shorting PFETs 116, 118 are turned off or are open and the NFET 120 in parallel with the current source shorts out the current source FET 110. The smaller PFETs 112, 114 and switching NFETs 102, 104 remain active during the CMOS testing mode. PFET 112 and NFET 102; and PFET 114 and NFET 104 form a pair of CMOS inverters during the CMOS testing mode.

Figure 2:
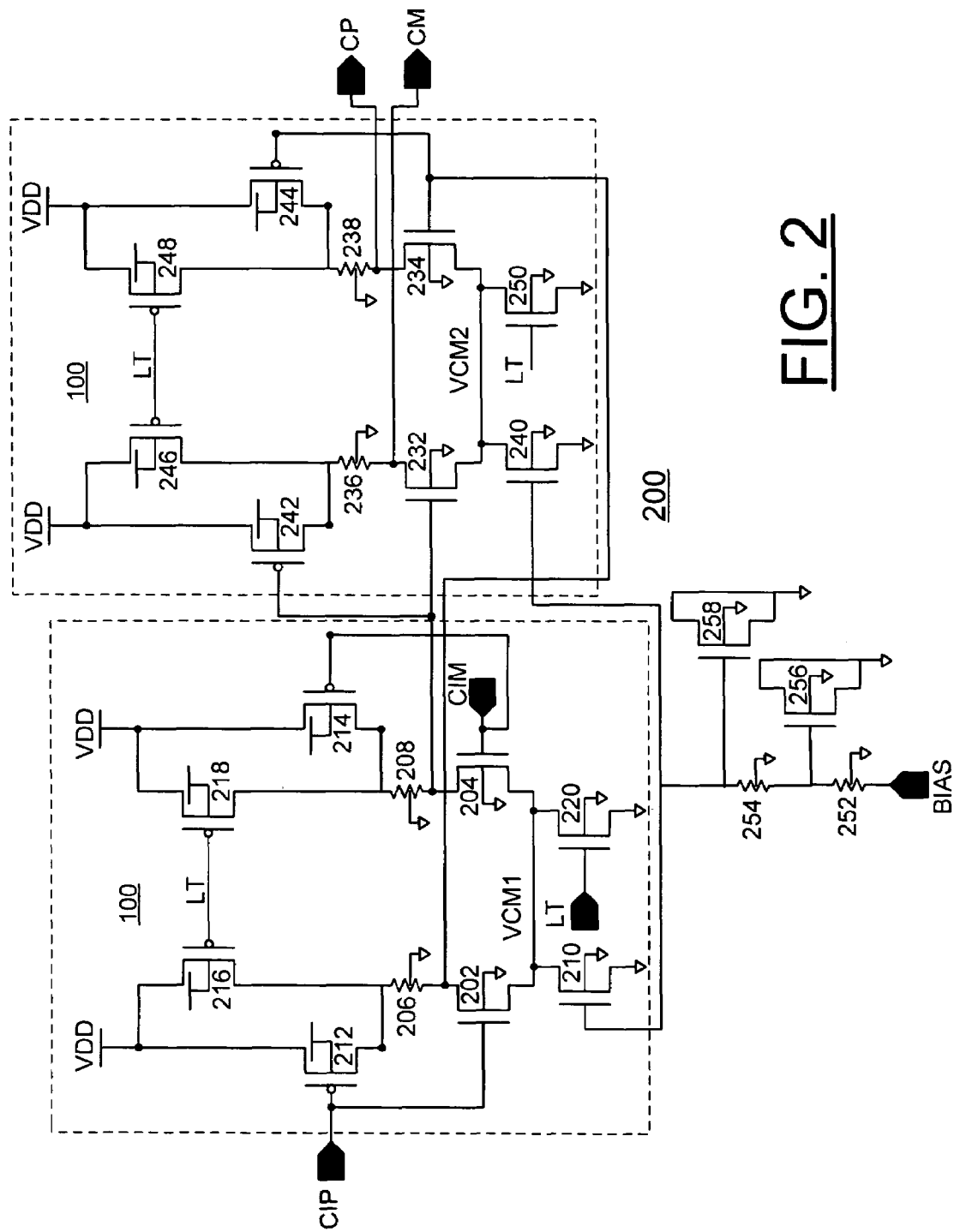
FIGS. 2, 3, are 4 are schematic diagrams respectively illustrating a differential clock buffer, a differential multiplexer, and a differential latch implemented using the dual mode, analog differential and complementary metal oxide semiconductor (CMOS) logic circuit of FIG. 1 in accordance with the preferred embodiment.

Referring now to FIG. 2, there is shown an exemplary clock buffer circuit implemented with the dual mode, analog differential and CMOS logic circuit 100 in accordance with the preferred embodiment generally designated by the reference character 200. Clock buffer circuit 200 includes a first stage and a second stage of the dual mode, analog differential and CMOS logic circuit 100 of FIG. 1. Clock buffer circuit 200 includes the two stages of circuit 100 to provide a necessary power output.

The first stage of the dual mode, analog differential and CMOS logic circuit 100 is formed by a pair of NFETs 202, 204, a pair of load resistors 206, 208 and an NFET current source 210 at the common source connection of the NFET switching pair 202, 204. A first pair and a parallel second pair of PFETs 212, 214 and PFETs 216, 218 are connected in series between the load resistors 206, 208 and a voltage supply rail VDD. A control NFET 220 in parallel with the current source NFET 210 is connected between the common source connection of the switching NFET pair 202, 204 at node labeled VCM1 and ground. One of a pair of differential true and complement input clock signals CIP, CIM respectively is applied to a gate of the respective switching NFETs 202, 204 and respective PFETs 212, 214. The leak test (LT) signal is applied to the gates of the PFETs 216, 218 that are connected together and is applied to the NFET 220. The PFETs 216, 218 are substantially larger than the PFETs 212, 214.

The second stage of dual mode, analog differential and CMOS logic circuit 100 is connected in series with the first stage of circuit 100 and is formed by a pair of NFETs 232, 234, a pair of load resistors 236, 238 and an NFET current source 240 at the common source connection of the NFET switching pair 232, 234. A first pair and a parallel second pair of PFETs 242, 244 and PFETs 246, 248 are connected in series between the load resistors 236, 238 and a voltage supply rail VDD. A control NFET 250 in parallel with the current source NFET 240 is connected between the common source connection of the switching NFET pair 232, 234 at node labeled VCM2 and ground. The differential true and complement output signals at the junction of the respective switching NFETs 202, 204 and load resistors 206, 208 of the first stage respectively are applied to a gate of the respective switching NFETs 232, 234 and respective PFETs 242, 244. The leak test (LT) signal is applied to the gates of the PFETs 246, 248 that are connected together and to the NFET 250. The PFETs 246, 248 are substantially larger than the PFETs 242, 244. The BIAS signal is applied to the current source NFETs 210 and 240 via a resistor capacitor circuit formed by a pair of series connected resistors 252, 254 and a pair of NFETs 256, 558 defining thin oxide capacitors, each having a common source and drain connection tied to ground and a gate coupled to the series connected resistors 252, 254, as shown.

The second stage of dual mode, analog differential and CMOS logic circuit 100 provides a pair of output signals or differential true and complement output clock signals (CP), (CM) at the junction of the respective switching NFETs 232, 234 and load resistors 236, 238 during both normal analog differential circuit function and test CMOS logic circuit function. During the CMOS testing mode, the current source NFET 240 is disabled and the PFETs 246, 248 are turned off responsive to the activated leak test LT signal. The smaller PFETs 242, 244 and switching NFETs 232, 234 form a pair of CMOS inverters during the CMOS testing mode providing a differential output signal CP, CM of a full rail-to-rail swing signal from a positive supply rail to a negative supply rail.

Figure 3:
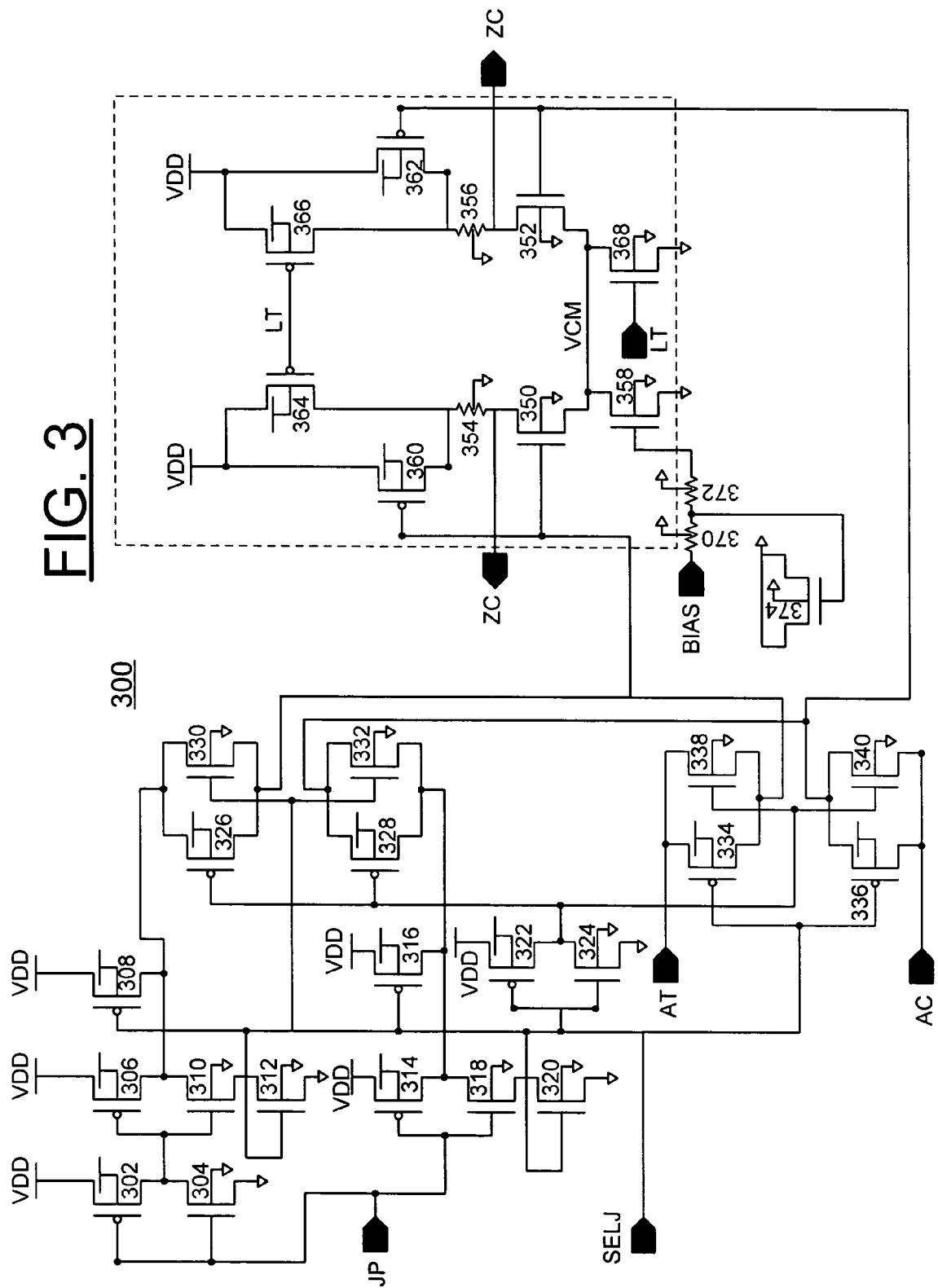

Referring now to FIG. 3, there is shown an exemplary differential multiplexer circuit implemented with the dual mode, analog differential and CMOS logic circuit 100 in accordance with the preferred embodiment generally designated by the reference character 300. Differential multiplexer circuit 300 includes an output stage of the dual mode, analog differential and CMOS logic circuit 100 of FIG. 1.

A plurality of inputs including a multiplexer input (JP), a multiplexer select input (SELJ), and conventional pair of differential true and complement input signals (AT) and (AC) are applied to the differential multiplexer circuit 300. The multiplexer input JP is applied to a first inverter formed by a series connected PFET 302 and NFET 304. The inverted JP output at the drain and source connection of PFET 302 and NFET 304 is applied to a first 2-way NAND formed by PFETs 306, 308 and NFETs 310, 312; and the multiplexer input JP is applied to a second 2-way NAND formed by PFETs 314, 316 and NFETs 318, 320. The multiplexer select input SELJ is applied to the respective gate of PFETs 308, 316. The multiplexer select input SELJ also is applied to a second inverter formed by a series connected PFET 322 and NFET 324 and to the respective gate of NFETs 312, 320. The outputs of the 2-way NANDs at the respective drain and source connections of PFETs 306, 308 and NFET 310 and of PFETs 314, 316 and NFETs 318 and the multiplexer select input SELJ are applied to a first pair of pass-gate circuits respectively formed by PFET 326 and NFET 330, and PFET 328 and NFET 332, as shown. A second pair of pass-gate circuit respectively formed by PFET 334 and NFET 338, and PFET 336 and NFET 340, is coupled to the first pass-gate circuits. The conventional differential true and complement input signals AT and AC are applied to the second pair of pass-gate circuits. The pair of 2-way NANDs, redundant for the pass-gate circuits, provides noise isolation. The pass-gate circuits disconnect the output from the input, if off; and provide the output equal to the input, if on. The differential true and complement output signals of the pass-gate circuits respectively are applied to the output stage of the dual mode, analog differential and CMOS logic circuit 100 of the exemplary differential multiplexer circuit 300.

The output stage of the dual mode, analog differential and CMOS logic circuit 100 is formed by a pair of switching NFETs 350, 352, a pair of load resistors 354, 356 and an NFET current source 358 at the common source connection of the NFET switching pair 350, 352. A first pair and a parallel second pair of PFETs 360, 362 and PFETs 364, 366 are connected in series between the load resistors 354, 356 and a voltage supply rail VDD. A control NFET 368 in parallel with the current source NFET 358 is connected between the common source connection of the switching NFET pair 350, 352 at node labeled VCM and ground. The differential true and complement output signals of the passgate circuits respectively are applied to a gate of the respective switching NFETs 350, 352 and respective PFETs 360, 362. The leak test LT signal is applied to the gates of the PFETs 364, 366 that are connected together and to the NFET 368. The PFETs 364, 366 are substantially larger than the PFETs 360, 362. The BIAS signal is applied to the current source NFET 358 via a resistor capacitor circuit formed by a pair of series connected resistors 370, 372 and an NFET 374 defining a thin oxide capacitor with a common source and drain connection tied to ground and a gate coupled to a junction of the series connected resistors 370, 372.

Differential multiplexer outputs ZC, ZT are provided at the respective junction of NFET 350 and load resistor 354; and NFET 352 and load resistor 356 of the output stage of the dual mode, analog differential and CMOS logic circuit 100 of the exemplary differential multiplexer circuit 300. During the CMOS testing mode, the PFETs 364, 366 are turned off or open responsive to the leak test LT signal and the current source NFET 358 is disabled by the control NFET 368 responsive to the leak test LT signal pulling node VCM to ground. The small PFETs 360, 362 and NFETS 350, 352 form a pair of CMOS inverters during the CMOS testing mode providing a differential output signal ZC, ZT of a full rail-to-rail swing signal from a positive supply rail to a negative supply rail.

Figure 4:
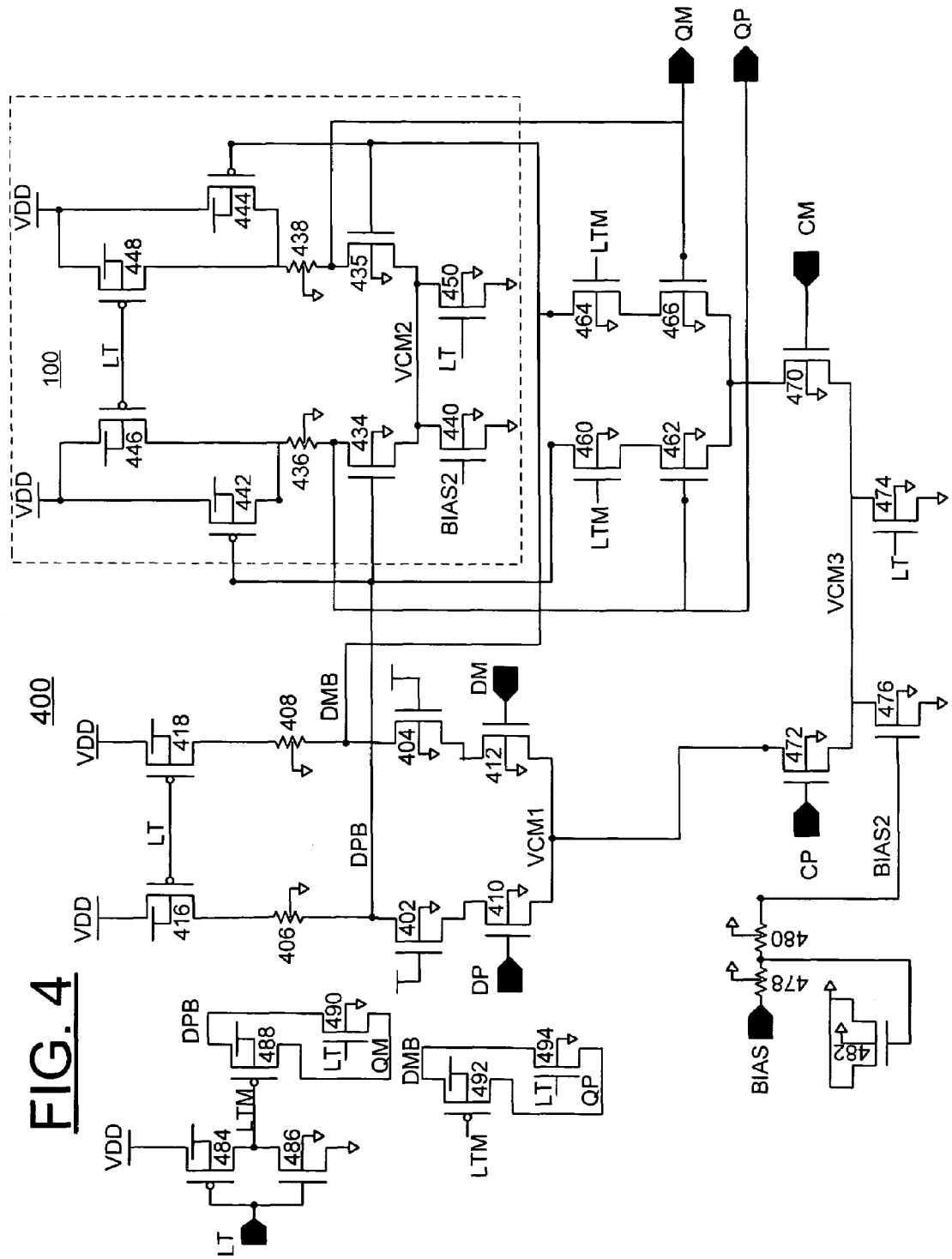

Referring now to FIG. 4, there is shown an exemplary differential latch circuit implemented with the dual mode, analog differential and CMOS logic circuit 100 in accordance with the preferred embodiment generally designated by the reference character 400. A plurality of inputs including a BIAS input, a leak test input LT signal and two pairs of differential true and complement input signals (DP) and (DM); and (CP) and (CM) are applied to the differential latch circuit 400. The exemplary differential latch circuit 400 includes a first stage formed by a pair of NFETs 402, 404 coupled to a pair of load resistors 406, 408 at a respective node labeled DPB, DMB, and coupled via a pair of NFETs 410, 412 to a node labeled VCM1. A pair of PFETs 416, 418 connects the load resistors 406, 408 to a voltage supply rail VDD.

The differential outputs of the first stage at respective nodes DPB, DMB are applied to an output stage of the dual mode, analog differential and CMOS logic circuit 100 of FIG. 1. The output stage of the dual mode, analog differential and CMOS logic circuit 100 is formed by a pair of switching NFETs 434, 435, a pair of load resistors 436, 438 and an NFET current source 440 at the common source connection of the NFET switching pair 434, 435. A first pair and a parallel second pair of PFETs 442, 444 and PFETs 446, 448 are connected in series between the load resistors 436, 438 and a voltage supply rail VDD. A control NFET 450 in parallel with the current source NFET 440 is connected between the common source connection of the switching NFET pair 434, 435 at node labeled VCM2 and ground. The differential true and complement output signals of the first stage respectively are applied to a gate of the respective switching NFETs 434, 435 and respective PFETs 442, 444. A first pair and a second pair of series connected NFETs 460, 462; and NFETs 464, 466 are connected between the respective nodes DMB, DPB and via an NFET 470 to a node VCM3. The node VCM1 at the common source connection of NFETs 410, 412 of the first stage is connected via an NFET 472 to the node VCM3 at the common source connection of NFETs 470, 472. A current source NFET 474 is connected between node VCM3 and ground with a control NFET 476.

The BIAS signal is applied to a resistor capacitor circuit formed by a pair of series connected resistors 478, 480 and an NFET 482 defining a thin oxide capacitor with a common source and drain connection tied to ground and a gate coupled to a junction of the series connected resistors 478, 480 to provide a BIAS2 signal, as shown. The BIAS2 signal is applied to the gate of the current source NFETs 440, 476.

An inverted leak test (LTM) is generated with the leak test input LT signal applied to an inverter formed by a series connected PFET 484 and NFET 486. The inverted leak test LTM signal at the drain connection of the PFET 484 and NFET 486 is applied to two stages respectively formed by a PFET 488 and NFET 490 connected between nodes labeled DPB, QM; and a PFET 492 and an NFET 494 connected between nodes labeled DMB, QP. The leak test input LT signal is applied to the gate input of NFETs 490, 494 and the inverted leak test input LTM signal is applied to the gate input of the PFETs 488, 492.

The inverted leak test LTM signal is applied to the gate of NFETs 460, 464. Differential output signals QM, QP are provided at the respective junction connection of NFET 434 and load resistor 436, and NFET 435 and load resistor 438 and is applied to a gate input of NFETs 462, 466. The leak test input LT signal is applied to the gates of the PFETs 446, 448 that are connected together and to the control NFETs 450, 476. The PFETs 446, 448 are substantially larger than the PFETs 442, 444.

During the CMOS testing mode, the PFETs 446, 448 are turned off or are open responsive to the leak test LT signal and the current source NFETs 440, 476 are disabled by the respective control NFETs 450, 474 responsive to the leak test LT signal pulling nodes VCM2 and VCM3 to ground. The small PFETs 442. 444 and NFETs 434, 435 form a pair of CMOS inverters during the CMOS testing mode to provide a differential output signal QM, QP of a full rail-to-rail swing signal from a positive supply rail to a negative supply rail.

While the present invention has been described with reference to the details of the embodiments of the invention shown in the drawing, these details are not intended to limit the scope of the invention as claimed in the appended claims.

What is claimed is:

1. A dual mode, analog differential and complementary metal oxide semiconductor (CMOS) logic circuit comprising:
 a differential input for receiving a differential input signal;
 a switch pair coupled to said differential input;
 a pair of load resistors coupled to said switch pair defining a differential output for providing a differential output signal;
 a current source coupled to said switch pair;
 a control input for receiving a control signal; and
 control circuitry coupled to said control input for disabling said current source to select a CMOS testing mode responsive to said control signal being activated.

2. A dual mode, analog differential and complementary metal oxide semiconductor (CMOS) logic circuit as recited in claim 1 includes a first pair of field effect transistors and a second pair of field effect transistors connected in parallel between said pair of load resistors and a voltage supply rail; said first pair of field effect transistors being substantially larger than said second pair of field effect transistors.

3. A dual mode, analog differential and complementary metal oxide semiconductor (CMOS) logic circuit as recited in claim 2 wherein said first pair of field effect transistors connect said pair of load resistors to said voltage supply rail during normal analog differential mode and being open during the CMOS logic mode responsive to said control signal being activated.

4. A dual mode, analog differential and complementary metal oxide semiconductor (CMOS) logic circuit as recited in claim 3 wherein said second pair of field effect transistors connect said pair of load resistors to said voltage supply rail during the CMOS testing mode.

5. A dual mode, analog differential and complementary metal oxide semiconductor (CMOS) logic circuit as recited in claim 2 wherein said first pair of field effect transistors and said first pair of field effect transistors are P-channel FETs (PFETs).

6. A dual mode, analog differential and complementary metal oxide semiconductor (CMOS) logic circuit as recited in claim 5 wherein said control signal is applied to a gate input of said first pair of field effect transistors.

7. A dual mode, analog differential and complementary metal oxide semiconductor (CMOS) logic circuit as recited in claim 6 wherein said second pair of PFETs and said switch pair of NFETs form a pair of CMOS inverters during the CMOS testing mode.

8. A dual mode, analog differential and complementary metal oxide semiconductor (CMOS) logic circuit as recited in claim 7 wherein said pair of CMOS inverters during the CMOS testing mode provide said differential output signal of a full rail-to-rail swing signal.

9. A dual mode, analog differential and complementary metal oxide semiconductor (CMOS) logic circuit as recited in claim 5 wherein said switch pair are a switch pair of N-channel field effect transistors (NFETs).

10. A dual mode, analog differential and complementary metal oxide semiconductor (CMOS) logic circuit as recited in claim 9 wherein said current source is an NFET current source connected between a common source node connection of said NFET switch pair and ground and a bias input signal is applied to a gate of said NFET current source.

11. A dual mode, analog differential and complementary metal oxide semiconductor (CMOS) logic circuit as recited in claim 10 wherein said control circuitry includes a control NFET connected in parallel with said NFET current source and said control signal is applied to a gate of said control NFET.

12. A dual mode, analog differential and complementary metal oxide semiconductor (CMOS) logic circuit as recited in claim 1 wherein a differential clock buffer circuit is formed by a first stage and a second stage of the dual mode, analog differential and CMOS logic circuit connected in series.

13. A dual mode, analog differential and complementary metal oxide semiconductor (CMOS) logic circuit as recited in claim 1 wherein a differential multiplexer circuit includes an output stage formed by the dual mode, analog differential and CMOS logic circuit.

14. A dual mode, analog differential and complementary metal oxide semiconductor (CMOS) logic circuit as recited in claim 1 wherein a differential latch circuit includes an output stage formed by the dual mode, analog differential and CMOS logic circuit.

15. A dual mode, analog differential and complementary metal oxide semiconductor (CMOS) logic circuit as recited in claim 1 wherein said current source is an NFET current source and a bias input signal is applied to a gate of said NFET current source via a resistor capacitor filter circuit.

16. A dual mode, analog differential and complementary metal oxide semiconductor (CMOS) logic circuit as recited in claim 1 wherein said first pair of field effect transistors and said first pair of field effect transistors are P-channel FETs (PFETs); and said switch pair of field effect transistors are N-channel field effect transistors (NFETs).

17. A dual mode, analog differential and complementary metal oxide semiconductor (CMOS) logic circuit comprising:
   a differential input for receiving a differential input signal;
   a switch pair of field effect transistors coupled to said differential input;
   a pair of load resistors coupled to said switch pair of field effect transistors defining a differential output for providing a differential output signal;
   a first pair of field effect transistors and a second pair of field effect transistors connected in parallel between said pair of load resistors and a voltage supply rail; said first pair of field effect transistors being substantially larger than said second pair of field effect transistors;
   a current source field effect transistor coupled to said switch pair of field effect transistors;
   a control input for receiving a control signal; and
   control circuitry coupled to said control input for disabling said current source to select a CMOS testing mode responsive to said control signal being activated.

18. A dual mode, analog differential and complementary metal oxide semiconductor (CMOS) logic circuit as recited in claim 16 wherein said first pair of PFETs connect said pair of load resistors to said voltage supply rail during normal analog differential mode and are open during the CMOS testing mode responsive to said control signal being activated.

19. A dual mode, analog differential and complementary metal oxide semiconductor (CMOS) logic circuit as recited in claim 16 wherein said second pair of PFETs connect said pair of load resistors to said voltage supply rail during the CMOS testing mode.

20. A dual mode, analog differential and complementary metal oxide semiconductor (CMOS) logic circuit as recited in claim 16 wherein said second pair of PFETs and said switch pair of NFETs form a pair of CMOS inverters during the CMOS testing mode.

* * * * *